United States Patent [19]

Takahashi et al.

[11] 4,393,318

[45] Jul. 12, 1983

[54] SAMPLE AND HOLD CIRCUIT

[75] Inventors: Masayuki Takahashi, Utsunomiya; Kunihiko Goto, Kawasaki; Hisami Tanaka, Yokohama; Michinobu Ohhata, Kawasaki, all of Japan

[73] Assignee: Fujitsu Limited, Kawasaki, Japan

[21] Appl. No.: 154,949

[22] Filed: May 30, 1980

[30] Foreign Application Priority Data

Jun. 1, 1979 [JP] Japan .................... 54/68552

[51] Int. Cl.³ .................... H03K 17/687; G11C 27/02
[52] U.S. Cl. .................... 307/353; 307/577; 307/584
[58] Field of Search ............... 307/352, 353, 572, 577, 307/578, 584; 328/151, 165

[56] References Cited

U.S. PATENT DOCUMENTS

| | | | |
|---|---|---|---|
| 3,586,880 | 6/1971 | Fitzwater, Jr. | 307/353 |
| 3,594,589 | 7/1971 | Hall | 307/353 |
| 3,764,921 | 10/1973 | Huard | 307/353 |
| 4,010,388 | 3/1977 | Alvarez, Jr. | 307/578 |
| 4,048,525 | 9/1977 | Goldberg et al. | 307/353 |
| 4,176,289 | 11/1979 | Leach et al. | 307/578 |

*Primary Examiner*—John Zazworsky
*Attorney, Agent, or Firm*—Staas & Halsey

[57] ABSTRACT

A sample and hold circuit for holding a sampled voltage, having a first MOS transistor for sampling the input voltage and a holding capacitor for holding the sampled voltage, and further comprising a second MOS transistor. The source and the drain of the second transistor are both connected to the output terminal of the circuit. The gate-source capacitance of the first MOS transistor is the sum of the gate-source and gate-drain capacitances of the second MOS transistor. When a voltage for turning on or off the first MOS transistor is applied to the gate of the first MOS transistor, the second MOS transistor is turned off or on respectively. The effect of this invention is that the sampled voltage can be held constant while turning off the first MOS transistor.

10 Claims, 20 Drawing Figures

SAMPLE AND HOLD CIRCUIT

BACKGROUND OF THE INVENTION

1. Field of the Invention

This invention relates to a sample and hold circuit for sampling the instantaneous voltage of an analogue input signal and holding the sampled voltage at the output and more particularly, to a sample and hold circuit employing a metal-oxide semiconductor (MOS) transistor as a sampling switch and a capacitor as a holding means.

2. Description of the Prior Art

In general, a sample and hold circuit (hereinafter referred to as a S/H circuit) is comprised of a sampling switch and a holding capacitor. One end of the switch is connected to an input terminal of the circuit and another end of the switch is connected to an output terminal of the circuit as well as to the capacitor. An analogue signal is applied to the input signal. When the switch is turned on, the capacitor is charged, i.e. sampling is effected. After the sampling, the voltage is held even when the switch is turned off. Thus, the sampled voltage of an analogue signal is converted to a constantly held voltage. This technique is applied in, for example, an A/D converter.

In such a S/H circuit, it is important that the output voltage does not vary before and after turning off the switch. However, where a Metal Oxide Semiconductor (MOS) transistor is used as the sampling switch, there is a problem in that the output voltage is changed by switching the MOS transistor from an on state to an off state. The MOS transistor is comprised of a gate, a source, a drain, and a bulk silicon under the gate. The drain (or source) is connected to the input terminal of the S/H circuit, the source (or drain) is connected to the output terminal of the S/H circuit and to the holding capacitor, and the gate is used as a switching terminal. The MOS transistor is switched from the on state to the off state or vice versa by changing the control voltage applied to the state. The above-mentioned change of the output voltage is based on the following two causes. The first cause is that the control voltage applied to the gate in the on state is different from the control voltage in the off state, and the parasitic gate-source capacitance partially couples the control voltage change to the output terminal. The second cause is that the channel region formed between the source and the drain during the on state disappears in the off state, and the charge stored in the carriers must be dispersed.

In the prior art, in order to avoid voltage change at the output terminal, a dummy capacitor, which has the same capacity as the parasitic capacitor between the gate and the source of the MOS transistor is used. The dummy capacitor is connected, through an inverter, between the gate and the source outside and the MOS transistor. By this arrangement, the first cause of the above mentioned problem is in theory eliminated, as hereinafter described in detail. However, it is difficult in the manufacturing process to make the dummy capacitor have the same capacitance as the parasitic capacitor between the gate and the source in the MOS transistor. Therefore, in practice, the output voltage usually changes before and after the turning off of the MOS transistor. In addition, in this prior art circuit, the above-mentioned second cause is not taken into account.

SUMMARY OF THE INVENTION

It is, therefore, the primary object of the present invention to provide a sample and hold circuit employing a first MOS transistor as a sampling switch wherein the output voltage is kept substantially constant before and after the MOS transistor is turned off.

It is another object of the present invention to provide a sample and hold circuit employing a second MOS transistor as a dummy capacitor wherein a charge accumulator in the channel region of the first MOS transistor can be absorbed by the second MOS transistor after the first transistor is turned off.

It is still another object of the present invention to provide a sample and hold circuit wherein the capacitance of the dummy capacitor can easily be made the same as the parasitic capacitance between the gate and the source of the first MOS transistor.

These objects of the present invention are realized by a sample and hold circuit for holding a sample input voltage having an input terminal, an output terminal, a first field-effect transistor for sampling an input voltage applied to the input terminal, the first field-effect transistor being connected between the input terminal and the output terminal, and a holding capacitor for holding the sampled input voltage, wherein the sample and hold circuit further comprises a second field-effect transistor whose source and drain are commonly connected to the output terminal, whose gate is adapted to receive a control voltage obtained by inverting a gate voltage applied to the first field-effect transistor, and whose size is approximately half of the size of the first field-effect transistor.

It is preferable that the first field-effect transistor be comprised of:

three diffusion regions as source or drain regions, each of the three diffusion regions being separated from each other by a constant distance for forming two channel regions, each of the channel regions being formed between and adjacent two of said diffusion regions; and a gate electrode covering said two channels regions.

It is still further preferable that the second field-effect transistor be comprised of two diffusion regions.

The exact nature of this invention, as well as other object and advantages thereof, will be readily apparent from the following explanation with reference to the accompanying drawings, in which like reference characters and numerals designate the same or similar parts.

DESCRIPTION OF THE PREFERRED EMBODIMENT

Before describing the preferred embodiment of the present invention, (A) the principle of an S/H circuit will be explained with reference to FIGS. 1A through 1D, (B) the principle and the problems of the S/H circuit employing a MOS transistor as a sampling switch will be explained with reference to FIGS. 2A through 2G, and (C) a prior-art S/H circuit will be explained with reference to FIGS. 3A through 3C.

Figure 1A:
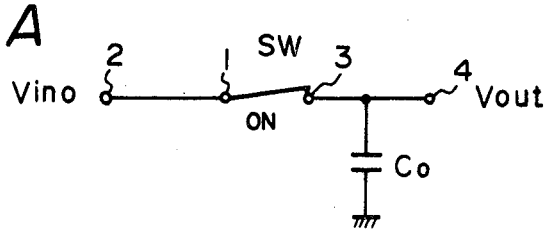
FIG. 1A is a circuit diagram of a sample and hold circuit used for explaining the principle of a sampling operation.
Figure 1B:
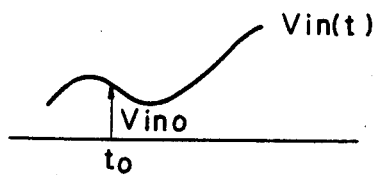
FIG. 1B is an analogue wave form applied to the input of the circuit of FIG. 1A.
Figure 1C:
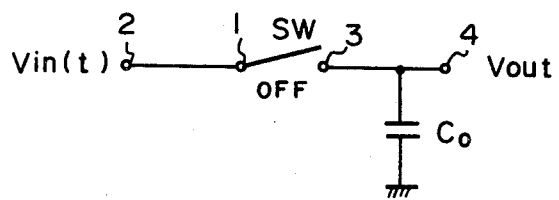
FIG. 1C is a circuit diagram of the sample and hold circuit used for explaining the principle of a holding operation.
Figure 1D:
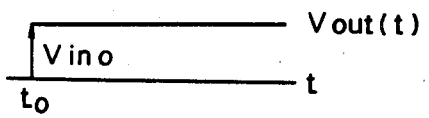
FIG. 1D is a constant wave form obtained at the output of the circuit of FIG. 1C.

(A) Referring to FIG. 1A, an S/H circuit is generally comprised of a sampling switch SW and a holding capacitor $C_O$. One end 1 of the switch SW is connected to an input terminal 2 of the S/H circuit, and another end 3 of the switch SW is connected to an output terminal 4 of the circuit and to the holding capacitor $C_O$. An analogue signal, such as the one illustrated in FIG. 1B, is applied to the input terminal 2. At time $t_O$, the switch SW is turned on as illustrated in FIG. 1A. When the switch SW is turned on, the holding capacitor $C_O$ is charged so that the voltage across the capacitor $C_O$ becomes $V_{ino}$ at the time $t_O$, i.e. sampling is effected. After the sampling, the switch SW is turned off, as illustrated in FIG. 1C. The voltage $V_{ino}$ across the holding capacitor $C_O$ remains constant after the switch SW is turned off. Therefore, the output voltage $V_{out}$ at the output terminal 4 is kept constant at the voltage $V_{ino}$ after the sampling time $t_O$, as illustrated in FIG. 1D. It is important in such an S/H circuit that the output voltage does not vary before and after the switch is turned off.

Figure 2A:
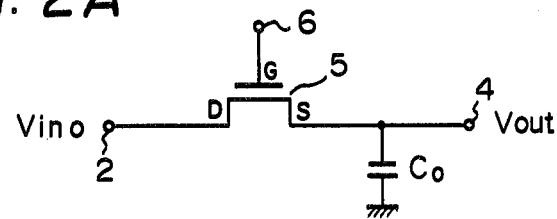
FIG. 2A is a sample and hold circuit diagram employing a MOS transistor as a sampling switch, used for explaining the principle of a sampling and holding operation.

(B) Referring to FIG. 2A, a MOS transistor 5 is used as the sampling switch SW. The drain D and the source S of the MOS transistor 5 are connected to the input and output terminals 2 and 4, respectively. The gate G of the MOS transistor 5 is connected to a switching terminal 6. If the MOS transistor is n-type, a high voltage of, for example, 5 V is applied through the switching terminal 6 to the gate G to turn on the MOS transistor 5. In order to change the MOS transistor 5 from the on state to an off state, a low or negative voltage of, for example, minus 5 V is applied through the terminal 6 to the gate G. If the MOS transistor is p-type, a low or negative voltage is applied to the gate G to turn on the MOS transistor, and a high voltage is applied to the gate to turn off the transistor.

Figure 2B:
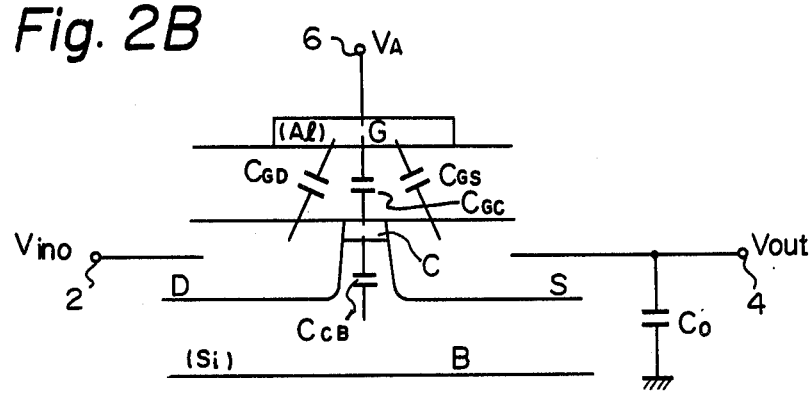
FIG. 2B is a schematic structural diagram of the MOS transistor when it is in an on state.

FIG. 2B is a schematic structural diagram of the MOS transistor when it is in the on state. As illustrated in FIG. 2B, the MOS transistor in the on state is comprised of a bulk silicon B, a source region S and a drain region D formed on the bulk silicon B, a channel region C between the source region S and the drain region D, an insulating layer of $SiO_2$ formed atop the source, channel and drain regions, and a gate region G formed atop the insulating layer. In the MOS transistor, there are parasitic capacitances represented as a capacitor $C_{GS}$ between the gate and the source, a capacitor $C_{GD}$ between the gate and the drain, a capacitor $C_{GC}$ between the gate and the channel, and a capacitor $C_{CB}$ between the channel and the bulk silicon. A voltage $V_A$ of, for example, 5 V, for turning on the MOS transistor is applied to the switching terminal 6.

Figure 2C:
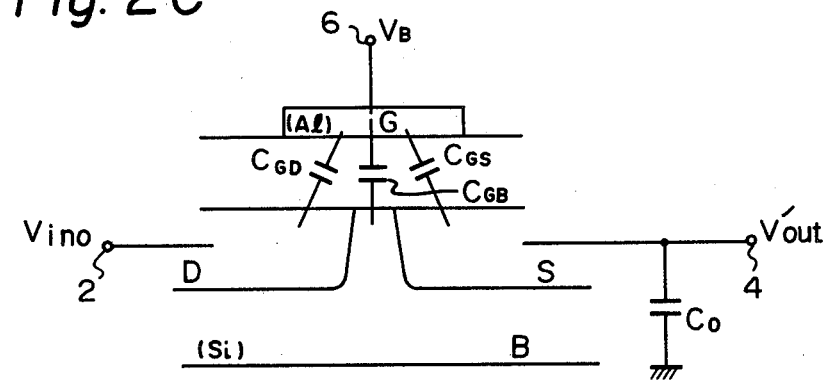
FIG. 2C is a schematic structural diagram of the MOS transistor when it is in an off state.

FIG. 2C is a schematic structural diagram of the MOS transistor in the off state. The differences between FIG. 2B and 2C are that the channel region C in FIG. 2B has dispersed in FIG. 2C, and the voltage applied to the switching terminal 6 has changed from $V_A$ to $V_B$ (of, for example, minus 5 V) turning off the MOS transistor. Because the channel region disappears in the off state, the capacitors $C_{GC}$ and $C_{CB}$ in FIG. 2B are replaced by a capacitor $C_{GB}$ between the gate and the bulk silicon. By these differences between FIGS. 2B and 2C, the output voltage $V_{out}$ in FIG. 2B, which is equal to the input voltage $V_{ino}$ of the analogue signal, is changed to $V'_{out}$, FIG. 2C, which is not equal to the input voltage $V_{ino}$. A first reason why the output voltage is changed when the MOS transistor is turned off will now be described with reference to FIGS. 2D and 2E.

Figure 2D:
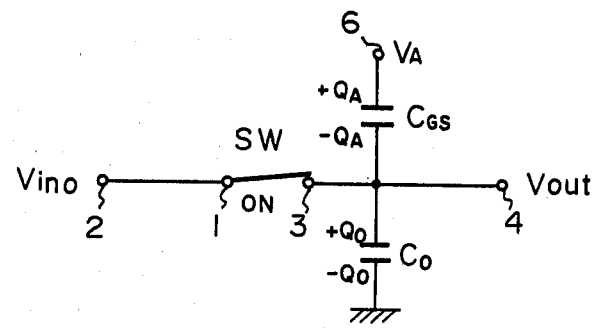
FIG. 2D is an equivalent circuit diagram of the circuit of FIG. 2A when the MOS transistor is in an on state.
Figure 2E:
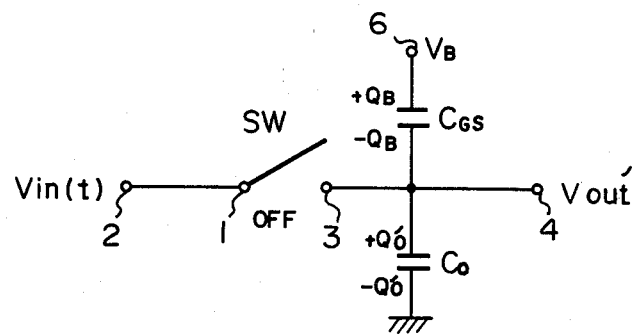
FIG. 2E is an equivalent circuit diagram of the circuit of FIG. 2A when the MOS transistor is in an off state.

FIG. 2D is an equivalent circuit diagram of FIG. 2B, and FIG. 2E is an equivalent circuit diagram of FIG. 2C. For the purpose of simplicity, only the capacitor $C_{GS}$ among the parasitic capacitors is illustrated in FIGS. 2D and 2E. In FIG. 2D, the voltage $V_A$ for turning on the MOS transistor is applied to the switching input 6 and, therefore, the switch SW is turned on. In FIG. 2E, the voltage $V_B$ for turning off the MOS transistor is applied to the control input 6 and thus the switch SW is turned off. Let it be assumed that, when the voltage $V_A$ is applied to the gate, the amount of charge stored in the capacitor $C_{GS}$ is $Q_A$ and the amount of charge stored in the holding capacitor $C_O$ is $Q_O$. When the control voltage is changed from $V_A$ to $V_B$, as illustrated in FIG. 2E, the amount of charge stored in the capacitor $C_{GS}$ is changed from $Q_A$ to $Q_B$ and the amount of charge accumulated in the capacitor $C_O$ is changed from $Q_O$ to $Q_O'$. According to the well known Charge-Conversion Law, the following relation can be obtained.

$$-Q_A + Q_O = -Q_B + Q_O'$$

The charges $Q_A$, $Q_O$, $Q_B$, and $Q_O'$ can be represented as:

$$Q_A = C_{GS}(V_A - V_{out})$$

$$Q_O = C_O V_{out}$$

$$Q_B = C_{GS}(V_B - V'_{out})$$

$$Q_O' = C_O V'_{out}$$

Therefore, the voltage difference between $V_{out}$ and $V'_{out}$ can be expressed as:

$$V'_{out} - V_{out} = \frac{V_B - V_A}{C_O + C_{GS}} C_{GS}$$

Since the voltage $V_A$ for turning on the MOS transistor is different from the voltage $V_B$ for turning off the MOS transistor, the off-state output voltage $V'_{out}$ is not equal to the on-state output voltage $V_{out}$ in the on state. As a result, the sampled voltage $V_{out}$, which is equal to the input voltage $V_{ino}$ at the sampling time $t_O$, cannot be held after turning off the MOS transistor.

Figure 2F:
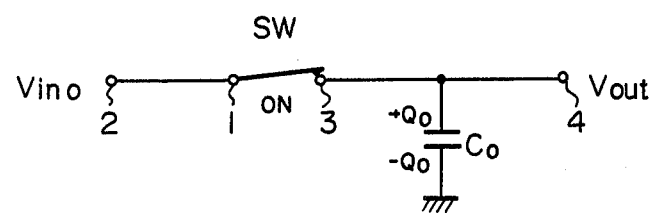
FIGS. 2F and 2G illustrate the on state and the off state, respectively, of another equivalent circuit of FIG. 2A.
Figure 2G:
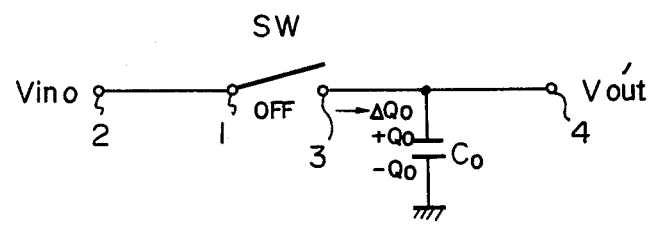

A second reason why the output voltage is changed when the MOS transistor is turned off will now be described with reference to FIGS. 2F and 2G. FIG. 2F is another equivalent circuit diagram of FIG. 2B, and FIG. 2G is another equivalent circuit diagram of FIG. 2C. In FIGS. 2F and 2G, the parasitic capacitors $C_{GS}$ and $C_{GD}$ are not illustrated, for the purpose of simplicity. When the MOS transistor is turned on, charge is stored between the gate and the channel, and between the channel and the bulk silicon. When the MOS transistor is turned off, the channel region disappears as described above (FIG. 2C). Therefore, a part of the stored charge flows into the source region and the drain region. The charge which has flowed into the source region is then stored in the holding capacitor $C_O$. Let it be assumed that the amount of charge stored in the holding capacitor $C_O$ in the on state is $Q_O$ and the amount of additional charge which has flowed into the capacitor $C_O$ in the off state $\Delta Q_O$. Then, the following relations are obtained.

$$Q_O = C_O V_{out}$$

$$Q_O + \Delta Q_O = C_O V'_{out}$$

Therefore, the amount of variation of the voltages between $V_{out}$ and $V'_{out}$ can be expressed as:

$$V_{out} - V'_{out} = \Delta Q_O / C_O$$

As a result, the sampled voltage $V_{out}$ also cannot be held after turning off the MOS transistor.

(III) In a prior art sample and hold circuit, a MOS transistor was also employed as a sampling switch. FIG. 3A is the circuit diagram of this prior-art S/H circuit. As illustrated in FIG. 3A, a dummy capacitor 7 and an inverter 8 are connected in series between the gate and the source of the MOS transistor 5. The capacitance of the dummy capacitor 7 is the same as the parasitic capacitance $C_{GS}$ between the gate and the source within the MOS transistor. Otherwise the construction is the same as the construction of the circuit of FIG. 2A. When the voltage $V_A$ for turning on the MOS transistor 5 is applied to the gate of the MOS transistor via the input 6, the voltage $V_A$ is inverted by the inverter 8 to the voltage $V_B$ which is applied to the dummy capacitor 7. When the voltage $V_B$, for turning off the MOS transistor 5 is applied to the gate of the transistor 5 via input 6, the voltage $V_B$ is inverted by the inverter 8 to the voltage $V_A$, which is applied to the dummy capacitor 7.

Figure 3A:
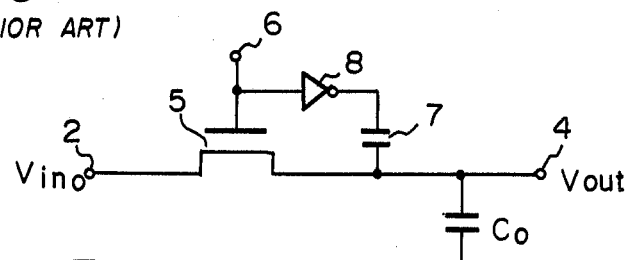
FIG. 3A is an example of a prior-art S/H circuit diagram employing a MOS transistor as a sampling switch.
Figure 3B:
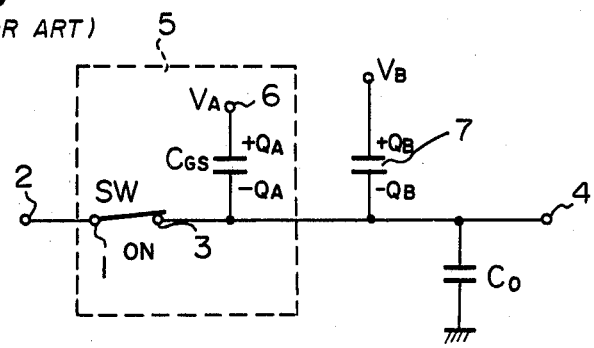
FIG. 3B is an equivalent circuit diagram of the circuit of FIG. 3A when the MOS transistor is in the on state.

FIG. 3B is an equivalent circuit diagram of FIG. 3A when the voltage $V_A$ is applied to the gate of the transistor 5. The voltage applied to the dummy capacitor 7 is equal to $V_B$, as mentioned above. The switch SW in FIG. 3B is turned on because the voltage $V_A$ for turning on the MOS transistor 5 is applied to the gate of the MOS transistor 5. Let it be assumed that, in this state, the amount of charge stored in the parasitic capacitor $C_{GS}$ is $Q_A$ and the amount of charge stored in the dummy capacitor 7 is $Q_B$.

Figure 3C:
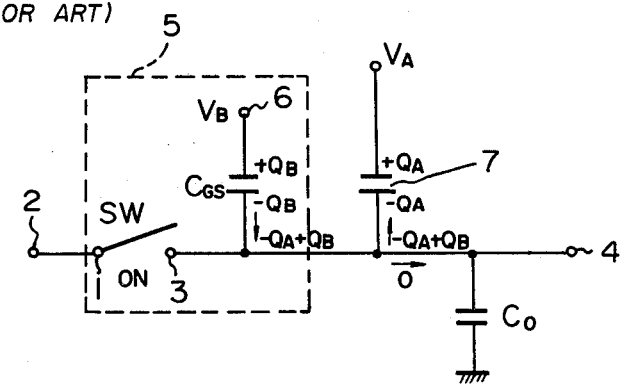
FIG. 3C is an equivalent circuit diagram of the circuit of FIG. 3A when the MOS transistor is in the off state.

FIG. 3C is an equivalent circuit diagram of FIG. 3A when the voltage $V_B$ is applied to the gate of the transistor 5. The voltage applied to the dummy capacitor 7 in this case is equal to $V_A$. The switch SW in FIG. 3C is turned off because the voltage $V_B$ for turning off the MOS transistor 5 is applied to the gate of the MOS transistor 5. Since the parasitic capacitance $C_{GS}$ is equal to the capacitance of the dummy capacitor 7, the amount of charge stored in the parasitic capacitance $C_{GS}$ is $Q_B$ and the amount of charge stored in the dummy capacitor 7 is $Q_A$, as indicated in FIG. 3C. Therefore, when the control voltage applied to the gate is changed from $V_A$ to $V_B$, the amount of charge flowing out from the parasitic capacitor $C_{GS}$ is $-Q_A + Q_B$, while the amount of charge flowing into the dummy capacitor 7 is also $-Q_A + Q_B$. Thus, no charge flows into the holding capacitor $C_O$ when the control voltage is changed. As a result, the output voltage $V_{out}$ in FIG. 3B is, in theory, equal to the output voltage $V'_{out}$ in FIG. 3C with respect to the variation of the control voltage.

However, there are problems in the above-mentioned prior-art S/H circuit. Firstly, the values of the parasitic capacitances $C_{GS}$ in various MOS transistors are not usually the same, because the values of the parasitic capacitances, vary depending on the manufacturing condition. In addition, since the dummy capacitor 7 is fabricated independent of the fabrication of the MOS transistor 5, it is difficult to fabricate the dummy capacitor 7 so that it has the same capacitance as the parasitic capacitor $C_{GS}$ in the MOS transistor 5. Accordingly, the output voltage $V'_{out}$ in the off state is, in practice, usually different from the output voltage $V_{out}$ in the on state. Secondly, in the above-mentioned prior-art S/H circuit, it is impossible to eliminate the output-voltage change due to the charge flow from the channel region into the source and the drain regions.

An embodiment of the present invention will now be described with reference to FIGS. 4A and FIGS. 5A through 5C.

Figure 4A:
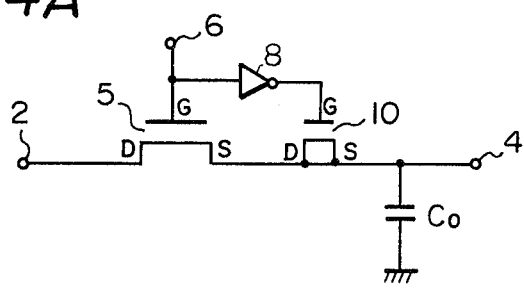
FIG. 4A is a S/H circuit diagram employing a MOS transistor as a sampling switch, according to an embodiment of the present invention.

FIG. 4A is a circuit diagram of a sample and hold circuit according to an embodiment of the present invention. As can be seen from FIG. 4A, the circuit of FIG. 4A is similar to the circuit of FIG. 3A, except that, instead of using the dummy capacitor 7, another MOS transistor 10 is employed in this circuit. The gate of the second MOS transistor 10 is connected through the inverter 8 to the control input terminal 6. The source and the drain of the second MOS transistor 10 are electrically shorted to each other and are connected to the source of the first MOS transistor 10. The second MOS transistor 10 is fabricated in such a way, as hereinafter described in detail, that the sum of the capacitances of the parasitic capacitors between the gate and the source and between the gate and the drain of the second MOS transistor 10 is substantially the same as the capacitance of the parasitic capacitor between the gate and the source of the first MOS transistor 5.

Figure 4B:
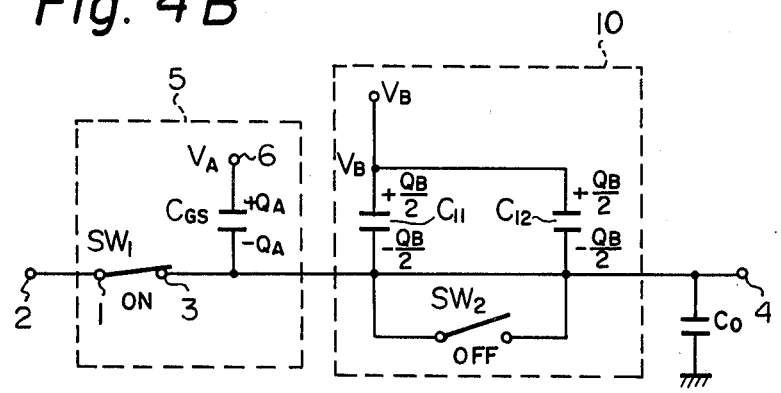
FIG. 4B is an equivalent circuit diagram of FIG. 4A when the MOS transistor is in an on state.

FIG. 4B is an equivalent circuit diagram of FIG. 4A when a voltage $V_A$ of, for example, plus 5 volts is applied to the switching terminal 6. In FIG. 4B, the first MOS transistor 5 is comprised of a first switch SW1 and the capacitor $C_{GS}$ connected in series between the input terminal 2 and the switching terminal 6. Since the voltage $V_A$ has been applied to the gate of the MOS transistor 5, the switch SW1 is in the on state. The second MOS transistor 10 is comprised of a second switch SW2 and two capacitors $C_{11}$ and $C_{12}$ connected in parallel. These capacitors $C_{11}$ and $C_{12}$ are the capacitors between the gate and the source and between the gate and the drain, respectively, each having one half the capacitance of the capacitor $C_{GS}$ of the first MOS transistor 5. The second switch SW2 is connected between the capacitors $C_{11}$ and $C_{12}$. The connecting point between the capacitor $C_{12}$ and the second switch SW2 is connected to the connecting point between the firet switch SW1 and the capacitor $C_{GS}$. The other end of the second switch SW2 is connected to the output terminal 4. The holding capacitor $C_0$ is connected between the output terminal 4 and the ground. Since the voltage applied to the gate of the second MOS transistor 10 is $V_B$ of, for example, minus 5 volts, the second switch SW2 is in the off state. In this condition, let it be assumed that the amount of charge stored in the capacitor $C_{GS}$ is $Q_A$ and the amount of charge stored in each of the capacitors $C_{11}$ and $C_{12}$ is $Q_B/2$. The voltage applied to the switching terminal 6 is then changed from $V_A$ to $V_B$ for holding the sampled voltage $V_{ino}$.

Figure 4C:
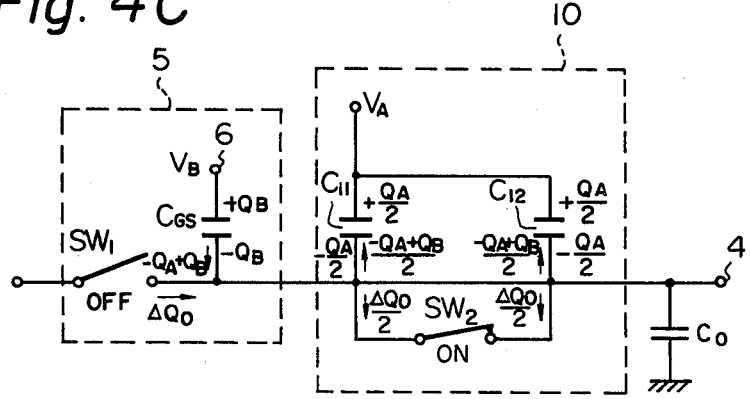
FIG. 4C is an equivalent circuit diagram of FIG. 4A when the MOS transistor is in an off state.

FIG. 4C illustrates an equivalent circuit diagram of FIG. 4A when the voltage $V_B$ is applied to the gate of the transistor 5. In this condition, the voltage $V_A$ is applied to the gate of the second MOS transistor 10 (FIG. 4A). Therefore, the first switch SW1 is in the off state and the second switch SW2 is in the on state. The capacitor $C_{GS}$ stores the charge $Q_B$ and each of the capacitors 11 and 12 stores the charge $Q_A/2$. As a result, when the state of the S/H circuit changes from the on state illustrated in FIG. 4B to the off state illustrated in FIG. 4C, charge flows out of the capacitor $C_{GS}$ in the amount of $-Q_B+Q_A$, while charge flows into each of the capacitors 11 and 12 in the amount $(-Q_B+Q_A)$. Accordingly, the charge which has flowed out from the capacitor $C_{GS}$ is completely absorbed by the two capacitors $C_{11}$ and $C_{12}$. Moreover, since the second MOS transistor 10 (FIG. 4A) is turned on in this condition, the amount of charge $\Delta Q_0$ which has flowed out from the channel region of the first MOS transistor 5 is completely absorbed by the channel region of the second MOS transistor 10. Consequently, no charge flows into the holding capacitor $C_0$ when the control voltage is changed from $V_A$ to $V_B$. Thus, the output voltage $V'_{out}$ after turning off the first MOS transistor 5 is equal to the output voltage $V_{out}$ before turning off the first MOS transistor 5. As mentioned above, this result can be obtained by satisfying the relation:

$$(C_{GS})_5 = (C_{GS})_{10} + (C_{GD})_{10} \qquad (1)$$

where, $(C_{GS})_5$ represents the capacitance between the gate and the source of the first MOS transistor 5, and $(C_{GS})_{10}$ and $(C_{GD})_{10}$ represent the capacitances between the gate and the source, and between the gate and the drain, respectively, of the second MOS transistor 10. The structures of the first and second MOS transistors 5 and 10 which satisfy the above condition will now be described with reference to FIGS. 5A through 5C.

Figure 5A:
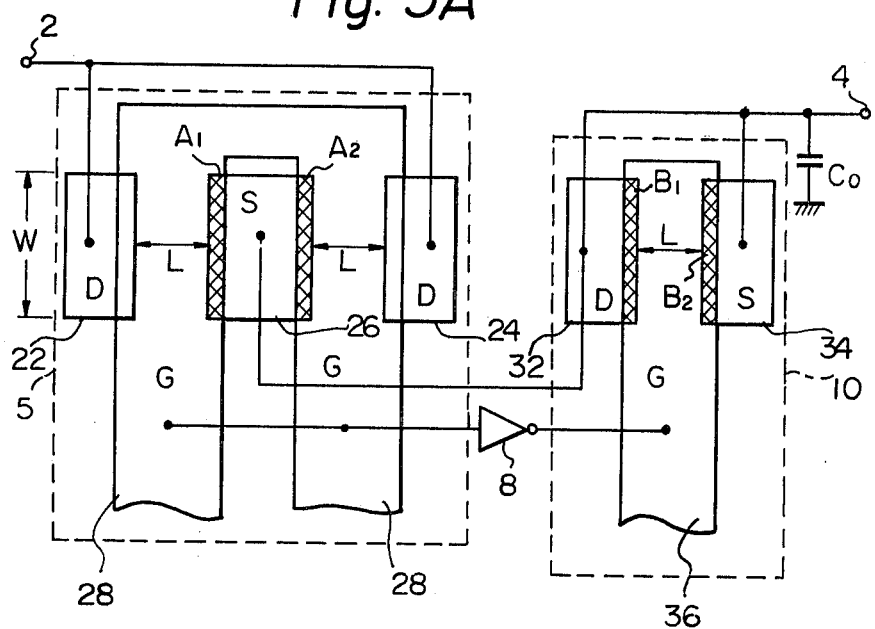
FIG. 5A illustrates a plan view of the sample and hold circuit according to an embodiment of the present invention.

FIG. 5A illustrates a plan view of the sample and hold circuit according to the above-mentioned embodiment of the present invention. As illustrated in FIG. 5A, the first MOS transistor 5 is comprised of two drain regions 22 and 24, one source region 26, and one gate region 28. The second MOS transistor 10 is comprised of one drain region 32, one source region 34 and one gate region 36. The distance between a drain region and a neighboring source region is constant for all cases and is denoted by "L". The width of each drain region or source region is constant and is represented by "W". In the first MOS transistor 10, two drain regions 32 and 34 are electrically connected by means of aluminum wiring, polysilicon wiring, etc. The capacitor between the gate and the source of the first MOS transistor 5 is represented in FIG. 5A by the crosshatched areas "$A_1$" and "$A_2$", which are the areas where source 26 overlaps the gate region 28. The capacitor between the gate 36 and the drain 32 of the second MOS transistor 10 is represented by the crosshatched area "$B_1$" which is the area where the drain 32 overlaps the gate region 36. Also, the capacitor between the gate 36 and the source 34 is represented by the crosshatched area $B_2$. Since the capacitance of a capacitor is proportional to the surface area of the capacitor, the above-mentioned formula (1) can be represented as:

$$A_1 + A_2 = B_1 + B_2 \qquad (2)$$

Therefore, it is sufficient to satisfy the above formula (2) for the S/H circuit of the present embodiment. By the structure illustrated in FIG. 5A, the above formula (2) can easily be satisfied in the manufacturing process. In the manufacturing process, a mask for forming, for example, the gate regions 28 and 36, may often suffer translation with respect to the positions of the drain and source regions.

Figure 5B:
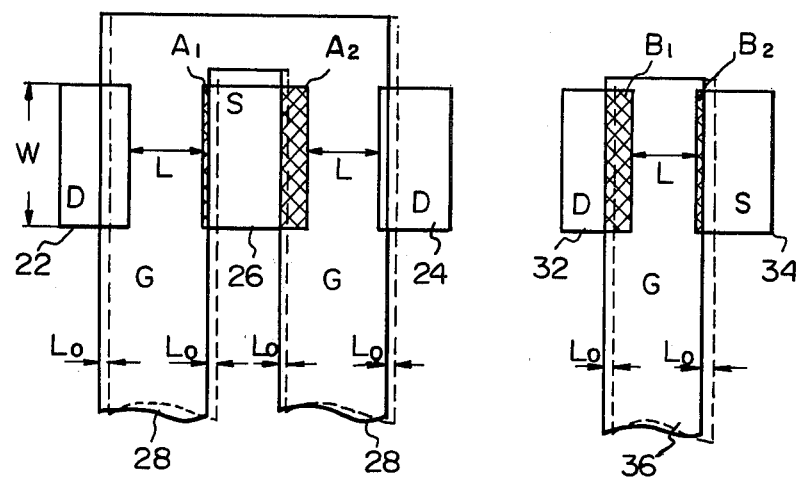
FIG. 5B illustrates a plan view of the S/H circuit when the gate regions are shifted to the left, according to an embodiment of the present invention.

FIG. 5B is a plan view of the S/H circuit when the gate regions 28 and 36 have been shifted to the left by the distance $L_0$ from the positions of the gate regions in FIG. 5A. The wiring is not illlustrated in FIG. 5B, for the purpose of simplification.. Since the gate region 28 is shifted by the same amount as the shift of the gate region 36, the amount of decrease in the area A1 is the same as the amount of decrease in the area B2, and the amount of increase in the area A2 is the same as the amount of increase in the area B1. Therefore, in spite of the shifting of the gate regions, the above formula (2) is satisfied. The shifted mask is not restricted to the one used for forming the gate regions, but alternatively, may be the one used for forming a wiring pattern, or for drain and source regions. In all of these cases, the above formula (2) can be satisfied.

Figure 5C:
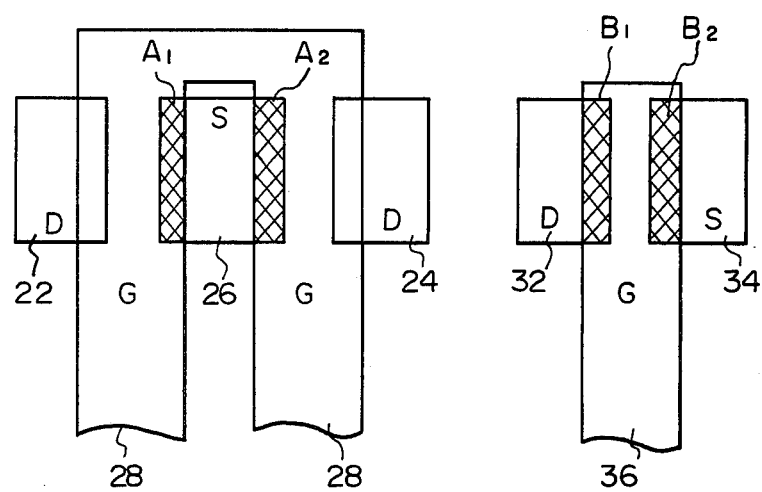
FIG. 5C illustrates a plan view of the S/H circuit when the area of the source and drain regions is increased, according to the embodiment of the present invention.

Also, in the manufacturing process, the area of the source or drain regions in one S/H circuit fabricated in one manufacturing step may often be different from the area of the source or drain regions in another S/H circuit fabricated in another manufacturing step, in spite of employing the same mask for forming the drain or source regions. FIG. 5C is a plan view of the S/H circuit of an embodiment when the area of the source and drain regions are increased in comparison with the source and drain regions in FIG. 5A, even when the same mask is used in the circuits of FIG. 5A and FIG. 5C. By an expansion of the source and drain regions 22, 24, 26, 32, and 34 in the transverse direction by the same amount, each of the areas A1, A2, B1, and B2 is increased by the same amount. Accordingly, the above formula (2) can be satisfied even when the area of the source and drain regions is increased. When the area of the source and drain regions is decreased, the formula (2) is also satisfied.

From the foregoing description of the preferred embodiment, it will be understood that, according to the present invention, a useful sample and hold circuit which can precisely hold the sampled input voltage can be provided.

We claim:

1. A sample and hold circuit, for holding a sampled input voltage, comprising:
   an input terminal;
   an output terminal;
   a first field-effect transistor, connected between said input terminal and said output terminal, for sampling an input voltage applied to said input terminal;
   means for applying a first control voltage to the gate of said first field-effect transistor for selectively switching said first field-effect transistor between conductive and non-conductive states,
   a holding capacitor, connected to said output terminal, for holding said sampled input voltage;
   means operatively connected to the gate of said first transistor for receiving and inverting the first control voltage and outputting the inverted voltage as a second control voltage;
   a second field-effect transistor having a source and drain commonly connected to said output terminal and a gate connected to said inverting means and receiving said second control voltage for selectively switching said second field-effect transistor between non-conductive and conductive states, relative to the conductive and non-conductive states, respectively, of said first field-effect transistor, wherein the sum of the capacitance between the gate and source plus the capacitance between the gate and the drain of said second field-effect transistor is approximately equal to the capacitance between the gate and the source of said first field-effect transistor, and the area of the channel region, defined by multiplying the channel length L times the channel width W, of said second field-effect transistor is approximately equal to half of the area of the channel region of said first field-effect transistor.

2. A sample and hold circuit as claimed in claim 1, wherein said first field-effect transistor comprises:
   three diffusion regions selectively forming predetermined source and drain regions, adjacent ones of said three diffusion regions being separated from each other by a first constant distance and forming two channel regions, each of said channel regions being formed between two adjacent ones of said diffusion regions, and a gate electrode covering said two channel regions.

3. A sample and hold circuit as recited in claim 2, wherein said second field-effect transistor comprises:
   two diffusion regions respectively forming source and drain regions separated from each other by a second constant distance and forming a channel region between said two diffusion regions, and a gate electrode covering said channel region.

4. A sample and hold circuit as claimed in claim 3, wherein said second constant distance between said two diffusion regions in said second field-effect transistor is approximately the same as said first constant distance in said first field-effect transistor.

5. A sample and hold circuit as claimed in claim 4, wherein the width of each of said three diffusion regions in said first field-effect transistor is approximately the same as the width of each of said two diffusion regions in said second field-effect transistor.

6. A sample and hold circuit as recited in claim 1, wherein the amplitude of said second control voltage which is effective to switch said second field-effect transistor to a non-conductive state is approximately equal to the amplitude of said first control voltage which is effective to switch said first field-effect transistor to a conductive state.

7. A sample and hold circuit as recited in claim 1 wherein the value of said second control voltage which is effective to switch said second field-effect transistor to a conductive state is approximately equal to the amplitude of said first control voltage which is effective to switch said first field-effect transistor to a non-conductive state.

8. A sample and hold circuit as claimed in claim 1, 6, 7, 2, 3, 4, or 5, wherein said first field-effect transistor and said second field-effect transistor are metal-oxide semiconductor transistors.

9. The circuit of claim 2, wherein two of said diffusion regions of said first transistor comprise drain regions.

10. The circuit of claim 2, wherein said gate-source and gate-drain capacitances of said second transistor are equal.

* * * * *

UNITED STATES PATENT AND TRADEMARK OFFICE
CERTIFICATE OF CORRECTION

PATENT NO. : 4,393,318
DATED : July 12, 1983
INVENTOR(S) : Masayuki Takahashi et al.

It is certified that error appears in the above-identified patent and that said Letters Patent is hereby corrected as shown below:

Col. 1, line 20, "input signal" should be --input terminal--.

Col. 2, line 20, "sample" (second occurrence) should be --sampled--;

line 45, "object" should be --objects--;

Col. 4, line 31, "dispersed" should be --disappeared--;

line 33, after "5V)" insert --,--.

Col. 5, line 65, after $V_B$, insert --,--;

Col. 5, line 66, after $V_B$, delete --,--.

Signed and Sealed this

Sixth Day of March 1984

[SEAL]

Attest:

Attesting Officer

GERALD J. MOSSINGHOFF

Commissioner of Patents and Trademarks